United States Patent [19]

Blackburn et al.

[11] Patent Number: 4,482,807

[45] Date of Patent: Nov. 13, 1984

[54] IMAGING DEVICES AND SYSTEMS

[75] Inventors: Anthony Blackburn, Southampton; John B. Readhead, Lyndhurst, both of England

[73] Assignee: U.S. Philips Corporation, New York, N.Y.

[21] Appl. No.: 355,839

[22] Filed: Mar. 8, 1982

[30] Foreign Application Priority Data

Mar. 30, 1981 [GB] United Kingdom ............... 8109819

[51] Int. Cl.³ .......................................... H01J 31/49
[52] U.S. Cl. .................................. 250/334; 250/370; 357/30
[58] Field of Search ............ 250/330, 332, 334, 370, 250/371; 357/30

[56] References Cited

U.S. PATENT DOCUMENTS 3,995,159 11/1976 Elliott ................................. 250/334
4,377,747 3/1983 Smith et al. ....................... 250/334

FOREIGN PATENT DOCUMENTS 1488258 12/1977 United Kingdom .
2019649 10/1979 United Kingdom .
2027985 2/1980 United Kingdom .
2027986 2/1980 United Kingdom .

Primary Examiner—Janice A. Howell
Attorney, Agent, or Firm—Marc D. Schechter

[57] ABSTRACT

In a thermal-radiation imaging device a detector element comprises a semiconductor strip, e.g. of n-type cadmium mercury telluride, on which biasing-electrode means are spaced for causing a bias current predominantly of majority charge carriers to flow along each strip. The bias current supports an ambipolar drift of radiation-generated charge carriers in the opposite direction. A readout area is present in a part of the drift path between a pair of spaced electrodes. At least one space extends locally across the width of strip in-between the spaced readout electrodes from at least one side of the readout area to narrow at least locally the drift path in the readout area and to increase the electric field. A detector having increased responsivity results, particularly when at least two spaces extend from opposite sides to form a meandering drift path in the read-out area. Close spacing of the readout electrodes permits good image resolution even with a long meandering drift path.

16 Claims, 7 Drawing Figures

IMAGING DEVICES AND SYSTEMS

BACKGROUND OF THE INVENTION

The invention relates to thermal-radiation imaging devices of the type having a detector element comprising a strip of semiconductor material in which free charge carriers can be generated on absorption of thermal radiation and in which an ambipolar drift of radiation-generated minority charge carriers can occur along the strip. The invention further relates to thermal-radiation imaging systems comprising such a device.

British Pat. No. 1,488,258 discloses a thermal-radiation imaging device comprising a strip of semiconductor material in which free charge carriers can be generated on absorption of thermal radiation incident on the strip. Biasing-electrode means are spaced in a direction along the strip for causing a bias current predominantly of majority charge carriers to flow along the strip. The bias current is capable of supporting an ambipolar drift of radiation-generated free minority charge carriers in the opposite direction to the bias current. A readout area is present in a part of the ambipolar drift path between a pair of spaced electrodes.

The semiconductor material of the strip is usually n-type cadmium mercury telluride. One of the two electrodes of the pair associated with the readout area is usually common with a biasing electrode. These electrodes may be of a metal such as aluminium which forms an ohmic contact to n-type cadmium mercury telluride. In the known device these readout electrodes extend across the width of the strip. The voltage developed between the pair of electrodes in use of the device is a measure of the density of minority carriers generated by the radiation and corresponding to successive elements of the thermal image which is scanned along the strip.

The spacing between the two read-out electrodes defines a localized sample area over which the ambipolar charge carrier density is averaged. The electrical signal derived from these electrodes is a measure of this averaged density. In order to obtain good image resolution from the device, it is desirable for the pair of read-out electrodes to have a close spacing. However, reducing this spacing reduces the resistance and minority-carrier transit time through the readout area. This reduces the noise and responsivity of the detector element, and may result in the detector output signal being degraded by the characteristics of an amplifier or other circuit connected to the read-out electrodes.

SUMMARY OF THE INVENTION

According to one aspect of the present invention there is provided a thermal-radiation imaging device having a detector element comprising a strip of semiconductor material in which free charge carriers can be generated on absorption of thermal radiation incident on the strip. Biasing-electrode means (also referred to herein as biasing means) are provided spaced in a direction along the strip for causing a bias current predominantly of majority charge carriers to flow along the strip. The bias current is capable of supporting an ambipolar drift of radiation-generated minority charge carriers in the opposite direction to the bias current. A read-out area is provided in a part of the ambipolar drift path between a pair of spaced electrodes. At least in a transverse direction in-between the pair of electrodes, at least one space extends locally across part of the width of the strip from at least one side of the read-out area to narrow at least locally the width of the continuation of the ambipolar drift path in the readout area thereby increasing the electric field within the read-out area.

At least as compared with its width in the absence of the space or spaces, the width of the drift path in the read-out area is narrowed at least locally by the inclusion of at least one such space. Advantageous read-out characteristics result from this narrowing of the drift path in the read-out area, and this space or spaces can be arranged in many different configurations to advantageously shape the strip in and around the read-out area so as to control advantageously the electric field distribution. Thus, the narrowing of the drift path in the readout area results in constriction of the bias current in this area and an increased electrical resistance, and so produces a high electric field. The higher electric field in the read-out area between the electrodes improves the device characteristics by increasing both the drift velocity in this area and the responsivity of the device while permitting the noise level to be more readily compatible with that of circuitry which may be connected to the readout electrodes.

In the structure of the known device described in United Kingdom No. 1,488,258, an increase in the length of the drift path and carrier transit time through the readout area results in a decrease in the spatial resolution. However, in a particularly advantageous form according to the present invention a longer (meandering) drift path is obtained in the readout area. The overall length of this drift path does not affect the close spacing of the pair of electrodes. The longer drift path has an increased electrical resistance, while an excessive transit time along this longer path is avoided by the higher electric field in the readout area. As a result, higher levels of responsivity can be obtained as well as good spatial resolution. Thus, preferably at least two of the spaces extend from different sides of the read-out area and throughout the thickness of the strip to produce in the readout area a meandering drift path so that the drift path in the readout area is longer than the spacing between the pair of electrodes. As will be illustrated later, many different forms and arrangements of such spaces are possible to produce such a meandering drift path.

In general very compact arrangements are desirable with close spacing of the pair of read-out electrodes. A particularly compact structure is obtained at an end of the strip when one electrode of the pair also provides one of the biasing-electrode means and when one space or at least one of the spaces extends adjacent to the one electrode across a part of the width of the strip.

At least the first electrode of the pair and the space or spaces can readily be arranged with respect to each other such that the shape of the equipotential lines of the electric field in the vicinity of the first electrode result in an effective readout length which is substantially the same as or even slightly less than the spacing between the pair of electrodes in the readout area. Thus, according to the invention, the spatial resolution of the device may be improved not only by having a close spacing between these readout electrodes while maintaining desirable responsivity and noise levels, but also by having an effective read-out length which is smaller than this close spacing.

In the direction of drift toward one of the biasing electrode means, at least the first electrode of the pair of readout electrodes may contact the drift path from the side of the strip opposite to the space and may extend in contact with the path across most or even all of the width of the strip. However, in order to reduce charge carrier recombination effects at the first readout electrode, it is preferable to reduce the contact area between this electrode and the drift path. For this reason and also so as to shape the electric field lines advantageously in the vicinity of the first electrode, it is particularly advantageous for the first electrode of the pair to contact the path only adjacent this side of the strip opposite the space and for the space or at least the first such space to extend toward this first electrode from the opposite side of the strip.

It should be noted that published United Kingdom patent application No. 2,019,649 describes a thermal-imaging device in which an ambipolar drift of radiation-generated minority carriers occurs along a meandering path toward a readout area of the device. In each case described in this application, the width of the ambipolar drift path in the readout area is either the same as or larger than its width in front of the readout area, and a completely straight portion of the strip between the pair of electrodes provides the continuation of the drift path in the readout area so that the path in this area is no longer than the spacing between the pair of electrodes. As described in United Kingdom No. 2,019,649, the meandering path before the read-out area is formed so as to restrict diffusive spread of the drifting charge-carriers between their generation along the strip and their detection at the readout area. For this reason, the meandering path is not continued through the read-out area.

By contrast, a meandering path employed according to the present invention occurs within the readout area between the pair of electrodes. As described above, this serves a completely different purpose from the meandering path of the devices described in United Kingdom No. 2,019,649. However, such a meandering readout path according to the present invention may also be employed in a device in which a meandering drift path is also included before the readout electrodes so as to restrict diffusion of the drifting carriers before they reach the readout area.

Devices according to the invention may be used in a system involving mechanical scanning means, such as described in British Pat. No. 1,488,258. Thus, according to a further aspect of the invention there is provided a thermal-radiation imaging system comprising a device or element according to the present invention, and means for scanning a thermal radiation image along the strip in the same direction as the ambipolar drift and at a rate corresponding substantially to the ambipolar drift velocity.

However, devices according to the invention may be used in thermal-radiation imaging systems using other forms of scanning, for example a system comprising means for applying a pulsed scanning voltage gradient to the strip via the biasing-electrode means so as to drive the radiation-generated carriers toward the readout means.

DESCRIPTION OF THE PREFERRED EMBODIMENTS

Figure 1:
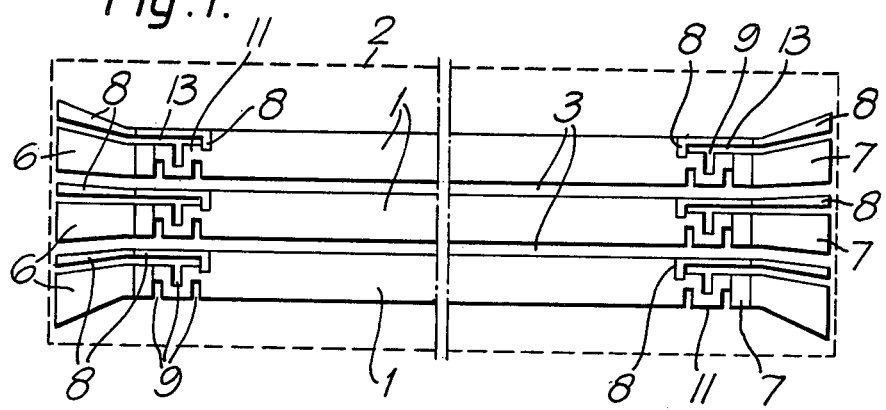
FIG. 1 is a plan view of a thermal-radiation imaging device according to the invention.

It should be noted that the Figures are not drawn to scale, and the relative dimensions and proportions of some parts have been exaggerated or reduced for the sake of clarity and convenience. The same reference numerals are used in the different Figures to indicate not only the same portions of the same device or element but also similar portions of different devices and elements.

Figure 2:
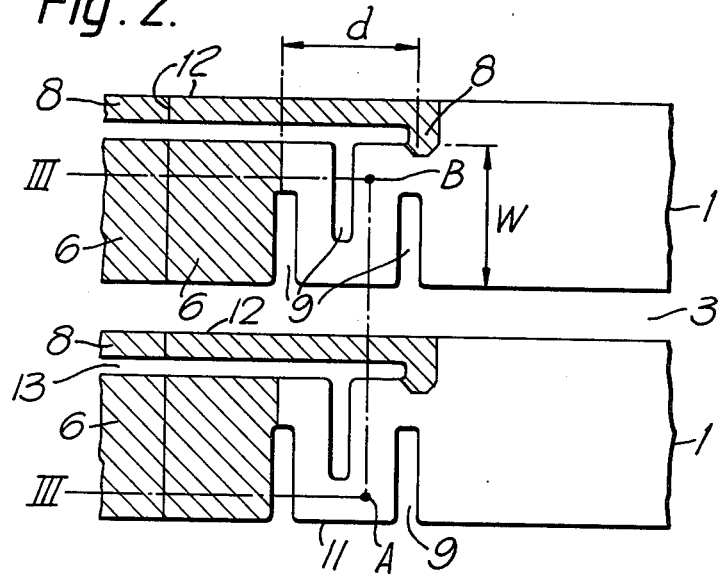
FIG. 2 is an enlarged plan view of part of the device of FIG. 1 showing readout areas of two of its elements.
Figure 3:
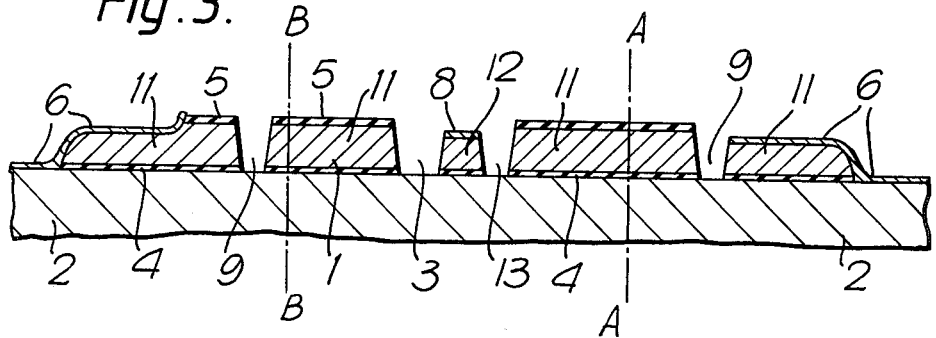
FIG. 3 is a cross-section on line III—III of FIG. 2.

The thermal-radiation imaging device of FIGS. 1 to 3 comprises a plurality of photoconductive elements 1 on a substrate 2. The elements 1 are semiconductor bodies in the form of substantially parallel elongate rectangular strips of semiconductor material of a given conductivity type in which free charge carriers can be generated on absorption of thermal radiation incident on the strip.

The semiconductor material may be, for example, n-type cadmium mercury telluride $Hg_{0.79}Cd_{0.21}Te$ having a carrier concentration of less than $5 \times 10^{14}$ cm$^{-3}$ in the absence of incident radiation. In material of this composition the radiation absorption edge at an operating temperature of 77° K. is at a wavelength of approximately 11.5 micrometers. In this material, the absorption of infrared radiation in the 8 to 14 micrometer window is effective in generating electron-hole pairs. The mobility of the holes at the intended temperature of operation of 77° K. is 600 cm$^2$ V$^{-1}$ sec$^{-1}$, and the lifetime is 2.5 microseconds. The electron mobility is approximately $2.10^5$ cm$^2$ V$^{-1}$ sec$^{-1}$.

Each strip 1 may, for example have a length of 1 mm., a width of 62.5 micrometers, and a thickness of 10 micrometers. The strips 1 may be separated by slots 3 having a width of, for example, 12.5 micrometers. FIG. 1 shows by way of example three such separated strips 1. It will be evident that different systems may require a different number of strips and different dimensions for their length, width, thickness and spacing.

The substrate 2 may be of sapphire. The semiconductor strips 1 may be secured to the substrate by a layer of epoxy adhesive which may be, for example, 0.5 micrometer thick. For the sake of clarity, this adhesive layer is not shown in FIG. 3. On the lower surface and upper surface of each semiconductor strip 1 there is a passivating layer 4 and 5, respectively. Each passivating layer may be approximately 0.1 micrometer thick, and may consist mainly of oxides of mercury, cadmium and tellurium.

The upper passivating layer 5 has been removed from both opposite ends of the upper surface of each strip 1 where biasing electrodes 6 and 7 are present. These electrodes may consist of deposited layers of gold of approximately 1 micrometer thickness, each in ohmic contact with the semiconductor surface. As illustrated in FIG. 3, the electrodes 6 and 7 may be sunk over a short distance, for example 1 or 2 micrometers, in the semiconductor surface. They may be formed using the ion-etching and metal lift-off technique described and claimed in the published United Kingdom Patent Application No. 2,027,986.

The metal layers forming the electrodes 6 and 7 also extend on the substrate 2 where they serve as connection areas to which, for example, gold wire connections may be made when the device is mounted in a housing. As illustrated in FIG. 3, the upper edge of each of the strips 1 is more rounded at the opposite ends of the strip than it is along the sides of the strip. The metal layers forming the electrode connections 6 and 7 extend onto the substrate 2 over this more rounded edge. Ion-etching may be used to form the parallel semiconductor strips 1 from a single semiconductor body and to form the separate electrodes and their connections for each strip 1 from a metal layer deposited on the semiconductor body and on the substrate 2. The method described in published United Kingdom Patent Application No. 2,027,556 may be used.

By applying a D.C. bias voltage between electrodes 6 and 7 spaced along each of the strips 1, a bias current predominantly of majority charge carriers (electrons, in this example) is caused to flow in a direction along the strip. This bias current is capable of supporting an ambipolar drift of radiation-generated free minority carriers (holes, in this example) in the opposite direction. The operation of the device will be described more fully later with reference to FIG. 7.

A readout area is present in a part of the ambipolar drift path between a pair of metal electrodes, either electrodes 6 and 8 at one end of each strip 1, or electrodes 7 and 8 at the opposite end. In the device of FIGS. 1 to 3, one electrode of each pair is formed by the wide biasing electrode at that end of the strip, and this electrode 6 or 7 extends right across the width of the drift path, whereas the other electrode 8 of each pair contacts the drift path only at one side. These readout electrodes (electrodes 8 and 6 and electrodes 8 and 7), which may be of gold, form ohmic contacts with the semiconductor strips 1. A part 11 of each strip 1 between the electrode pairs (electrodes 8 and 6 or electrodes 8 and 7) provides the continuation of the ambipolar drift path through the readout area.

According to the present invention, at least in a transverse direction in-between the pair of readout electrodes, at least one space or gap 9 extends locally across part of the width of the strip 1 from at least one side of the strip part 11 (which forms the readout area) to narrow at least locally the width of the continuation of the ambipolar drift path in the readout area, thereby increasing the electric field within the readout area. The distance d corresponding to the spacing along a straight line between the electrodes is indicated in FIG. 2. In the particular form shown in FIGS. 1 to 3, three spaces have been formed as slots extending from different sides of the strip part 11 to produce in the read-out area a meandering drift path which is longer than the spacing d between the pair of readout electrodes. The slots 9 in the device of FIGS. 1 to 3 are substantially straight and parallel to each other. The drift path in the readout area is narrowed by the slots 9 to a width less than half the width w of the path in the absence of these slots 9.

Preferably these slots 9 are as narrow as possible with steep side walls so that the readout area in which they are incorporated can have a close spacing d between its readout electrodes. The ion-etching technique described and claimed in the published United Kingdom patent application No. 2,027,985 can be used to form such slots 9 with steep side-walls and with a width which need be no larger than, for example, the thickness of the strips 1 (10 micrometers in this example).

Thus, in the FIG. 2 structure the spacing d may be, for example, 50 micrometers, and the width of each slot 9 may be, for example, approximately 7.5 micrometers. The readout area may have a width w of, for example, 35 micrometers and each slot 9 may extend approximately 20 micrometers across the width of the strip 1 from the sides of the strip part 11 which forms the readout area. Thus, the resulting width of the drift path in the readout area may be, for example, approximately 13 to 15 micrometers, and the resulting length of the readout meandering drift path between the electrodes (electrodes 8 and 6 or electrodes 8 and 7) may be approximately 100 micrometers.

A particularly compact readout structure is obtained at the end of each strip 1 in the device of FIGS. 1 to 3 because one electrode 6 or 7 of each readout electrode pair also forms one of the biasing electrodes, and because one of the slots 9 extends adjacent this electrode 6 or 7 across a part of the width of the strip 1.

The slots 9 adjacent an electrode (6, 7 or 8) can be formed by ion-etching through a part of the adjacent electrode metallization as well as through the underlying semiconductor material. As described in United Kingdom No. 2,027,985, this can facilitate the device manufacture, and it is especially useful for increasing manufacturing tolerances in aligning the desired ion-etching pattern and the desired metallization pattern.

The narrowing and lengthening of the drift path in the strip part 11 as a result of the slots 9 results in a significant increase in both the electrical resistance and the electric field in the readout area between the readout electrodes (electrodes 8 and 6 or electrodes 8 and 7). As a result, a higher level of responsivity can be obtained without causing excessive transit time of minority carriers through the readout area.

Figure 4:
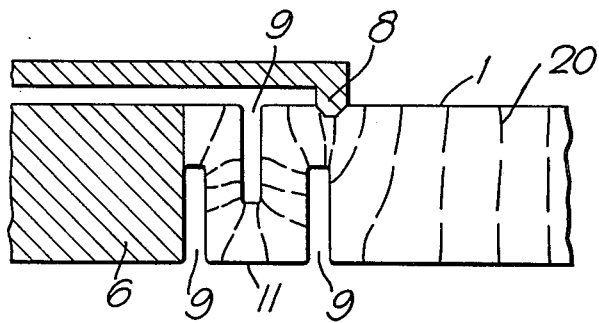
FIG. 4 is a plan view of part of a thermal-radiation imaging device according to the invention and having a similar readout area geometry.

Equipotentials which occur in the electric field distribution in a meandering readout structure similar to those of FIGS. 1–3 are indicated by broken lines 20 in FIG. 4. Because (in the direction of drift toward the biasing electrode 6) the first of the slots 9 is on the opposite side of the strip 1 from that contacted by the first readout electrode 8, the field lines 20 in front of the electrode 8 bend slightly toward the readout area, as shown in FIG. 4. As a result, the effective readout length determining the spatial resolution of the detector element is no longer than the spacing d between the electrodes 8 and 6. With the field distribution shown in FIG. 4 the effective readout length is substantially the same as the spacing d. However, by extending the width of the first slot 9 into the main part of the drift path in front of the electrode 8 (i.e. to the right in FIG. 4) the field lines 20 may be bent more into the readout area to slightly shorten the effective readout length.

Increases in responsivity of, for example, $2\frac{1}{2}$ times and increases in detectivity of, for example, 20% have been obtained by incorporating such slots 9 into the readout area to form a device having the readout geometries of FIGS. 2 and 4. Thus, for example, one such particular device, having a responsivity of just under $13 \times 10^4$ volts per watt and a noise of just under 6.5 nanovolts per (hertz)$^{\frac{1}{2}}$ in the absence of such slots 9, had with the slots 9 incorporated into its readout area a responsivity of $34.5 \times 10^4$ volts per watt and a noise of 14.5 nanovolts per (hertz)$^{\frac{1}{2}}$.

However, it appears that if the meandering drift path in the readout area is very narrow effects occurring at the side walls of this path (for example a higher recombination velocity) may reduce the further increase in responsivity which would otherwise result. For this reason the width of the meandering path in the readout area will generally be made more than the thickness of the strips 1, and the slots 9 will be made as narrow as possible.

The device of FIGS. 1 to 3 has readout areas at both ends of each strip 1. This permits readout with the strips 1 biased in either direction, i.e. either readout using electrodes 8 and 6 with the bias current from electrode 6 to electrode 7, or readout using electrodes 8 and 7 with the bias current from electrode 7 to electrode 6. Therefore, if the characteristics of the device as manufactured are better when biased in one direction rather than the other, then this one direction can be chosen for operation.

Figure 7:
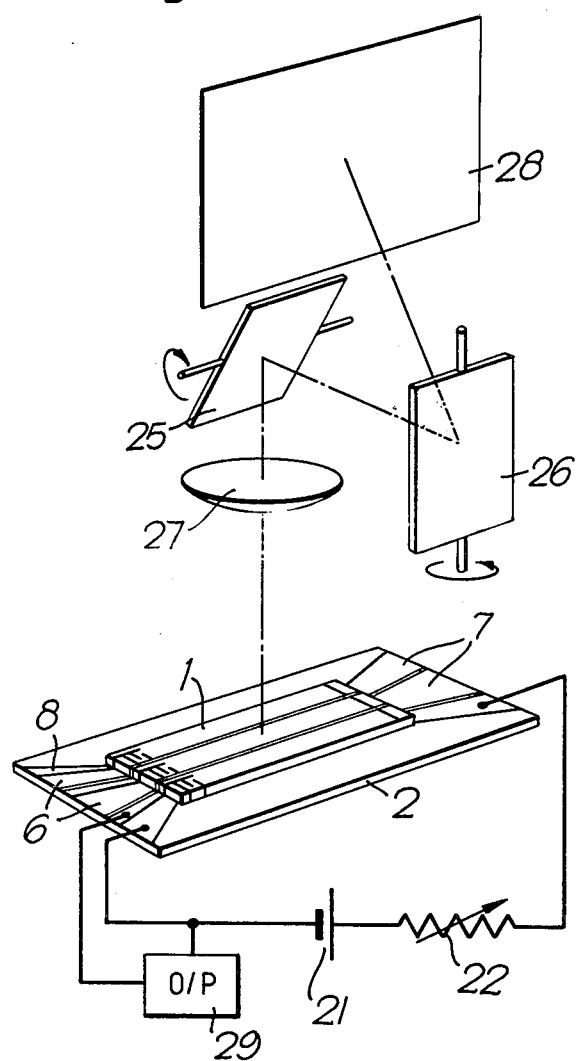
FIG. 7 is a partly schematic, perspective view of parts of a thermal-radiation imaging system according to the invention.

However, it is not necessary to have readout areas at both ends of the strips 1. Thus, for example FIG. 7 illustrates an arrangement in which no readout area is provided adjacent the electrode 7 end of the strips 1. In the FIG. 7 arrangement, the metal layer which provides the separate electrodes 7 of each strip 1 extends over the end of each strip 1 and onto the substrate 2.

It is also possible for the second electrode of the pair of readout electrodes to be separate from the biasing electrode 6 or 7. In this case, for example, the second readout electrode of each pair may be like the first electrode 8 and contact the ambipolar drift path adjacent only one side of the strip 1.

In the embodiment of FIGS. 1 to 3, at the readout areas each of the strips 1 divides into two branches 11 and 12 (see FIGS. 2 and 3). Each branch is separated from the other by slot 13 which extends from that area in a direction substantially parallel to the strip 1. As described above, the part 11 provides the meandering continuation of the ambipolar drift path from the readout area to the adjacent biasing electrode 6 or 7. The metal layer forming the electrode 8 extends from the readout area in a direction substantially parallel to the slot 13. This metal layer forms the metal stripe connection of the readout electrode 8. It is supported by the other branch 12, and it is separated by the slot 13 from the adjacent biasing electrode 6 or 7.

The metal layer 8 is sunk over a short distance in the semiconductor surface. It also extends over the more rounded end edges of the strips 1 and onto the substrate 2 to form areas for wire connections. The pattern of these metal stripes 8 may be formed simultaneously from the same metal layer as the electrodes 6 and 7, and the slots 9 and 13 may be formed simultaneously with the slots 3 using an appropriate masking pattern in the same ion-etching step. The slots 13 may also each have a width of, for example, 12.5 micrometers.

Thus, in the FIGS. 1 to 3 structure the width of the ambipolar drift path before the readout area (i.e. to the right of the electrode 8 in FIG. 2) is larger than the width w of the readout area, so that the continuation of the drift path in the readout area is narrowed by both the slots 9 and the slot 13. In the FIG. 4 structure, however, the width w is the same as the width of the drift path before the readout area. The metal stripe 8 in FIG. 4 may be supported similarly by a branched part 12 of the strip 1, or it may extend directly over the upper side wall of the strip 1 and onto the substrate 2, before continuing alongside the read-out and alongside biasing electrode 6.

During operation, the device is maintained at a cryogenic temperature, and so it is mounted according to the specific intended application. Such further mounting is not illustrated in the accompanying drawing, but it will normally consist of mounting the substrate 2 in an evacuated enclosure having a window for transmission of infrared radiation (for example in the 8 to 14 micrometer band). The enclosure will be provided with means for maintaining the substrate 2 with its semiconductor strips 1 at the required operating temperature (for example 77° K.) One such form of mounting consists of the Dewar-type encapsulation as commonly employed in the infrared detector art.

The operation of such a device according to the invention will now be described with reference to FIG. 7. Via its biasing electrodes 6 and 7 and wire connections, each strip 1 is connected in series with a D.C. bias source 21 and a variable resistor 22 to produce a constant bias current predominantly of majority charge carriers (in this case, electrons) flowing in the strips 1 in the longitudinal direction from the electrode 6 to the electrode 7. For the sake of clarity, the connections of bias source 21 to all the electrodes 6 and 7 are not shown in FIG. 7, which only illustrates the connections of one of the strips 1.

The bias current is capable of supporting an ambipolar drift of radiation-generated free minority carriers (in this case, holes) in the opposite direction as compared to the bias current, i.e. in the direction from electrode 7 to electrode 6. A suitable range of bias voltage between the electrodes 6 and 7 is from 1 volt to 10 volts. At a potential drop of 15 volts per cm. in the n-type material of the composition described above, the ambipolar mobility is approximately 400 $cm^2 V^{-1} sec^{-1}$.

The scanning of a radiation pattern and the focussing of an image of an elemental area of the pattern on the strips 1 may be achieved in a similar manner to that described in British Pat. No. 1,488,258. Such means for scanning a thermal radiation image along the strips 1 in the same direction as the ambipolar drift and at a rate corresponding substantially to the ambipolar drift velocity are illustrated in a simplified schematic manner in FIG. 7. They may comprise a pair of rotatable mirrors 25 and 26 and a lens system 27. By these means, image areas of a radiation pattern from a scene 28 are moved with a velocity in the range of 5,000 $cm.sec^{-1}$ to 20,000 $cm.sec^{-1}$ along the surface of one or more of the semiconductor strips 1.

Thus, as the image is scanned across the surface of the semiconductor strips 1 at a rate corresponding to the ambipolar drift velocity, integration of the radiation-generated minority carriers occurs in the part of the n-type strips 2 where the radiation is incident before they reach the read-out electrode 8. The length of the ambipolar drift path in front of the relevant readout area and over which total integration of the radiation-generated minority carriers can be effected is limited to a distance determined by the lifetime of minority carriers in the semiconductor material, by the electric field, and by the ambipolar mobility which pertains to the semiconductor material and which usually approximates the minority carrier mobility. This distance therefore has to be taken into account in the positioning of the read-out area.

Due to the passage of these integrated radiation-generated minority carriers through the strip part 11 forming the readout area between the electrodes 8 and 6, conductivity modulation occurs in this part 11. The picture signal is derived in known manner using an output circuit 29 which is connected between the electrodes 8 and 6, and which amplifies and processes the voltage change occurring between the electrodes 8 and 6 as a result of the conductivity modulation. For the sake of clarity in the drawing, only the output circuit 29 for one strip 1 has been shown, whereas in practice separate output circuits 29 are provided for each strip 1 and are connected between the electrodes 6 and 8 of their respective strip.

It will be evident that many modifications are possible within the scope of the present invention. Thus, for example the composition of the n-type cadmium mercury telluride may be chosen differently, for example to provide a device for imaging radiation in the 3 to 5 micrometer band. Semiconductor materials other than cadmium mercury telluride may alternatively be used to form the photoconductive strips 1.

In the device structures of FIGS. 1 to 4, the first read-out electrode in the direction of drift is formed wholly by the metal stripe 8 which provides the main conductive path of the readout connection even when the semiconductor branch 12 is present. However, if the system in which the device is to be used can have a higher series resistance in the readout connection, the metal stripe 8 need not extend as far as the ambipolar drift path. In this case, the direct electrode connection to the ambipolar drift path is provided solely by the conductive path in the unmetallized semiconductor branch 12. An example of such an arrangement is illustrated in FIG. 5.

Figure 5:
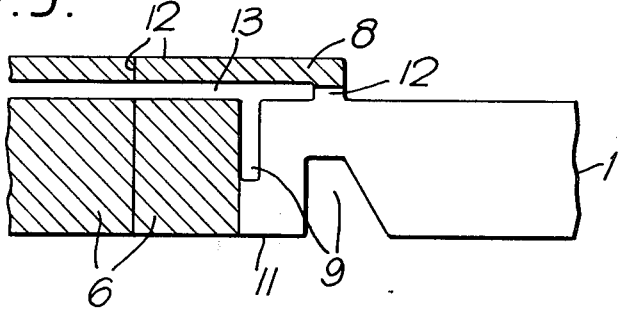
FIGS. 5 and 6 are plan views of parts of further thermal-radiation imaging devices according to the invention and having other forms of readout area geometry.

FIG. 5 also illustrates other possible modifications, namely the use of only two slots 9 to form the meandering drift path in the readout area, and an enlargement of the width of the first slot opposite the first readout electrode and into the main part of the drift path before the readout area. As mentioned above, the resulting electric field distortion may slightly shorten the effective read-out length compared with the spacing d between the pair of electrodes.

However, according to the present invention it is not even necessary to have two slots 9 in the readout area. Thus, for example, a locally-enhanced electric field and an increase in responsivity can be obtained when a single slot (which may correspond to any one of the slots 9 of FIGS. 2, 4 and 5) is used as the only space narrowing the continuation of the drift path in the readout area. When only a single slot 9 is used, a meandering drift path is not formed in the readout area, although the slot 9 still forms at least one bend in one side of the readout area.

In the FIG. 5 structure the two slots 9 form bends in the opposite sides of the readout area so that the drift path is bent into a meander.

The meandering drift path formed by the two slots 9 in the FIG. 5 structure has only two bends and so its length is only greater than the spacing d by an amount less the overall width w of the readout area.

Figure 6:
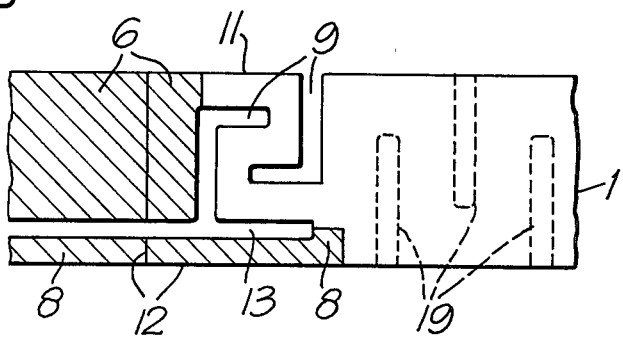

The read-out area of the device of FIG. 6 also includes only two slots 9 to form the meandering path, but these slots 9 are L-shaped so that four bends and a longer meandering path are obtained. In this case the carrier drift in the middle part of the drift path between the L-shaped slots is in the opposite direction to the readiation image scan. However, because of the high drift velocity between the readout electrodes 6 and 8, this opposite drift in a part of the readout area appears to have no (or almost no) degrading effect on the spatial resolution of the detector element. However, if desired the readout area may be shielded from the scanned image by providing a radiation opaque covering between the pair of readout electrodes.

FIG. 6 also shows (in broken outline) further slots 19 which may be present in the main part of the strip 1 so as to produce a meandering drift path before the readout area, thereby restricting the diffusive spread of the drifting carriers before they reach the readout area. At least in the region leading to the readout area, the width of this main meandering drift path defined by the solts 19 may even be the same as that of the continuation of the path in the readout area as defined by the slots 9 or it may be wider as illustrated in FIG. 6.

Although the slots 9 (and 19) are illustrated in FIGS. 1 to 6 with substantially straight parallel sides which form a meandering path having abrupt corners at the bends, it should be understood that the masking pattern used in etching the slots can be so shaped that bends which are more rounded and curved can be obtained. Furthermore, although ion-etching forms the exposed side walls of the slots 3, 9 and 13, and these side walls are not shown as passivated in FIG. 3, a passivating layer can be provided in known manner on these exposed surfaces. Especially with narrow drift paths, this can be beneficial in decreasing carrier recombination effects at these side walls.

In the embodiments described, the strips 1 are formed as discrete semiconductor bodies on an insulating substrate, for example of sapphire. However, other arrangements are also possible according to the invention, in which the strips 1 are portions of a common semiconductor body and may be integrally united via a common portion which may support a common biasing electrode (6 or 7). None of the electrodes 6, 7 and 8 need extend onto the substrate 2 which may be of sapphire as in the previous embodiments.

In a further modified form, also according to the invention, the strips 1 may be formed from an epitaxial layer of one conductivity type material which is deposited on, for example, an intrinsic substrate 2 or a substrate 2 of cadmium telluride. In this form, the epitaxial material is removed at grooves 3, 13 and 9 to provide the element structure, and the biasing and readout electrode metallization 6, 7 and 8 is confined to the remaining epitaxial layer portions. The grooves 3 and 13 merge together to isolate the adjacent electrodes 6, 7 and 8, and wire connections are bonded to parts of the electrode pattern 6, 7 and 8 on the epitaxial layer remote from the active strip portions 1.

In order to remove any unwanted injected minority carriers (holes) from the ambipolar drift path adjacent to the main biasing electrode which forms the anode (electrode 7 in FIG. 7), there may be provided a rectifying junction with an electrode connection adjacent to this biasing electrode in order to provide a drain for such minority carriers. This structure effectively isolates the first stage of the ambipolar drift path from the biasing electrode. The electrode connection for such a rectifying junction may be provided in a manner similar to the connection for the readout means.

We claim:
1. A thermal-radiation imaging device comprising:
   a strip of semiconductor material in which free charge carriers can be generated on absorption of thermal radiation incident on the strip, said strip having a length and a width and two sides;

biasing electrode means for causing a bias current predominantly of majority charge carriers to flow along the length of the strip, said bias current being capable of supporting an ambipolar drift of radiation-generated minority charge carriers in a direction opposite to the bias current; and a pair of readout electrodes arranged adjacent to the semiconductor strip, said readout electrodes defining a readout area in the semiconductor strip which is between the readout electrodes and which is in the path of the ambipolar drift;

characterized in that in the readout area the semiconductor strip has at least one space forming at least one bend in one side of the strip, said space extending from the one side of the strip across part of the width of the strip, said space being arranged to reduce the width of the semiconductor strip in the readout area thereby increasing the electric field in the readout area.

2. A thermal-radiation imaging device comprising:
a strip of semiconductor material in which free charge carriers can be generated on absorption of thermal radiation incident on the strip, said strip having a length and a width and two sides;

biasing electrode means for causing a bias current predominantly of majority charge carriers to flow along the length of the strip, said bias current being capable of supporting an ambipolar drift of radiation-generated minority charge carriers in a direction opposite to the bias current; and a pair of readout electrodes arranged adjacent to the semiconductor strip, said readout electrodes defining a readout area in the semiconductor strip which is between the readout electrodes and which is in the path of the ambipolar drift;

characterized in that in the readout area the semiconductor strip has at least two spaces, said spaces extending from opposite sides of the strip across part of the width of the strip, said spaces being arranged to reduce the width of the semiconductor strip in the readout area thereby increasing the electric field in the readout area, and said spaces being arranged to increase the length of the ambipolar drift path in the readout area to produce a drift path which is longer than the length of a direct path between the readout electrodes.

3. A thermal-radiation imaging device as claimed in claim 2, characterized in that the spaces are substantially straight slots which extend substantially parallel to each other in an interdigitated arrangement.

4. A thermal-radiation imaging device as claimed in claim 3, characterized in that each slot has a width which is not greater than 10 micrometers.

5. A thermal-radiation imaging device as claimed in claim 3, characterized in that the semiconductor strip has a thickness, and each slot has a width which is not greater than the thickness of the strip.

6. A thermal-radiation imaging device as claimed in claim 3, characterized in that:
the biasing means comprises one of the readout electrodes which extends across the width of the strip, said electrode being a combined readout and bias electrode; and
one space in the semiconductor strip extends adjacent to the combined readout and bias electrode.

7. A thermal-radiation imaging device as claimed in claim 3, characterized in that in the direction of the ambipolar drift the first readout electrode contacts the semiconductor strip on one side of the strip, and one of the spaces in the semiconductor strip extends from the other side of the strip toward the first readout electrode.

8. A thermal-radiation imaging system comprising:
a thermal-radiation imaging device as claimed in claim 3; and
means for scanning a thermal-radiation image along the strip in the same direction as the ambipolar drift and at a rate corresponding substantially to the ambipolar drift velocity.

9. A thermal-radiation imaging device as claimed in claim 2, characterized in that the spaces are L-shaped slots.

10. A thermal-radiation imaging device as claimed in claim 9, characterized in that each slot has a width which is not greater than 10 micrometers.

11. A thermal-radiation imaging device as claimed in claim 9, characterized in that the semiconductor strip has a thickness, and each slot has a width which is not greater than the thickness of the strip.

12. A thermal-radiation imaging device as claimed in claim 9, characterized in that:
the biasing means comprises one of the readout electrodes which extends across the width of the strip, said electrode being a combined readout and bias electrode; and
one space in the semiconductor strip extends adjacent to the combined readout and bias electrode.

13. A thermal-radiation imaging device as claimed in claim 9, characterized in that in the direction of the ambipolar drift the first readout electrode contacts the semiconductor strip on one side of the strip, and one of the spaces in the semiconductor strip extends from the other side of the strip toward the first readout electrode.

14. A thermal-radiation imaging system comprising:
a thermal-radiation imaging device as claimed in claim 9; and
means for scanning a thermal-radiation image along the strip in the same direction as the ambipolar drift and at a rate corresponding substantially to the ambipolar drift velocity.

15. A thermal-radiation imaging system comprising:
a thermal-radiation imaging device as claimed in claim 2; and
means for scanning a thermal-radiation image along the strip in the same direction as the ambipolar drift and at a rate corresponding substantially to the ambipolar drift velocity.

16. A thermal-radiation imaging system comprising:
a thermal-radiation imaging device as claimed in claim 1; and
means for scanning a thermal-radiation image along the strip in the same direction as the ambipolar drift and at a rate corresponding substantially to the ambipolar drift velocity.

* * * * *